(12) United States Patent
Qin et al.

(10) Patent No.: US 9,502,437 B2
(45) Date of Patent: Nov. 22, 2016

(54) METHOD OF MANUFACTURING ARRAY SUBSTRATE, ARRAY SUBSTRATE AND DISPLAY DEVICE

(71) Applicant: BOE TECHNOLOGY GROUP CO., LTD., Beijing (CN)

(72) Inventors: Wei Qin, Beijing (CN); Jiayang Zhao, Beijing (CN); Yuanbo Zhang, Beijing (CN); Xiangxiang Zou, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 14/355,352

(22) PCT Filed: Jun. 28, 2013

(86) PCT No.: PCT/CN2013/078341
§ 371 (c)(1),
(2) Date: Apr. 30, 2014

(87) PCT Pub. No.: WO2014/161238
PCT Pub. Date: Oct. 9, 2014

(65) Prior Publication Data
US 2015/0179669 A1    Jun. 25, 2015

(30) Foreign Application Priority Data
Apr. 2, 2013  (CN) .......................... 2013 1 0113145

(51) Int. Cl.
*H01L 27/12* (2006.01)
*H01L 21/308* (2006.01)
(Continued)

(52) U.S. Cl.
CPC ......... *H01L 27/124* (2013.01); *H01L 21/0272* (2013.01); *H01L 21/3081* (2013.01);
(Continued)

(58) Field of Classification Search
CPC ................ H01L 27/1288; H01L 43/08; H01L 29/78669; H01L 29/66765; H01L
(Continued)

(56) References Cited

U.S. PATENT DOCUMENTS

| 8,431,424 B2* | 4/2013 | Lin ................................ 438/28 |
| 2011/0073855 A1* | 3/2011 | Lin ................................ 257/43 |

(Continued)

FOREIGN PATENT DOCUMENTS

| CN | 101556935 | 10/2009 |
| CN | 101577255 | 11/2009 |

OTHER PUBLICATIONS

English translation of CN 101556935 b.*
Tan et al CN101577255 A English translation.*
International Preliminary Report on Patentability Appln. No. PCT/CN2013/078341; Dated Oct. 6, 2015.
Third Chinese Office Action Appln. No. 201310113145.8; Dated Jun. 9, 2015.
Second Chinese Office Action dated Feb. 9, 2015; Appln. No. 201310113145.8.

(Continued)

*Primary Examiner* — Latanya N Crawford
(74) *Attorney, Agent, or Firm* — Ladas & Parry LLP

(57) ABSTRACT

A method of manufacturing an array substrate, an array substrate and a display device are provided. The method of manufacturing the array substrate includes: forming a pattern of a gate metal layer including a gate line and a gate electrode and preserving photoresist at a position on the pattern of the gate metal layer corresponding to a gate lead hole; sequentially forming a gate insulating thin film, a semiconductor thin film and a source/drain metal thin film; removing the photoresist preserved at the position on the pattern of the gate metal layer corresponding to the gate lead hole, and forming the gate lead hole; forming a pattern of a source/drain metal layer including a source electrode, a drain electrode and a data line and a semiconductor layer; and forming a pattern including a pixel electrode layer and a channel.

7 Claims, 9 Drawing Sheets

(51) Int. Cl.
  *H01L 21/3213* (2006.01)
  *H01L 29/66* (2006.01)
  *H01L 29/786* (2006.01)
  *H01L 21/027* (2006.01)
(52) U.S. Cl.
  CPC ... *H01L 21/32133* (2013.01); *H01L 21/32139* (2013.01); *H01L 27/1222* (2013.01); *H01L 27/1288* (2013.01); *H01L 29/66765* (2013.01); *H01L 29/78669* (2013.01)
(58) Field of Classification Search
  CPC .............. 27/1222;H01L 21/32139; H01L 21/32133; H01L 21/3081; H01L 27/124
  See application file for complete search history.

(56) References Cited

U.S. PATENT DOCUMENTS

2012/0099058 A1* 4/2012 Qin .............................. 349/106
2015/0014692 A1* 1/2015 Wu ................................ 257/72

OTHER PUBLICATIONS

International Search Report mailed Feb. 1, 2014, PCT/CN2013/078341.
First Chinese Office Action dated Jun. 4, 2014; Appln. No. 201310113145.8.

* cited by examiner

METHOD OF MANUFACTURING ARRAY SUBSTRATE, ARRAY SUBSTRATE AND DISPLAY DEVICE

TECHNICAL FIELD

Embodiments of the present invention relate to a method of manufacturing an array substrate, an array substrate and a display device.

BACKGROUND

In the prior art, a TFT-LCD is formed by bonding a TFT array substrate with a color filter substrate, and liquid crystals are dripped between the array substrate and the color filter substrate. Generally, the TFT array substrate comprises a substrate, and a gate metal layer, a gate insulating layer, an amorphous semiconductor layer, a doped semiconductor layer, a source/drain metal layer and a pixel electrode layer are provided on the substrate, and the source/drain metal layer is spaced from the pixel electrode layer by an insulating layer. The gate metal layer comprises the gate electrodes and gate lines of the TFT, the source/drain metal layer comprises the source electrodes, drain electrodes and data lines of the TFT, and the pixel electrode layer comprises pixel electrodes.

Generally, the drain electrodes of the TFT are electrically connected with the pixel electrodes through a via hole which goes through the insulating layer between the source/drain metal layer and the pixel electrode layer. In addition, a gate lead hole and a source/drain lead terminal are provided on the TFT array substrate, and the gate lead hole goes through the layers on the gate metal layer and extends to the gate metal layer, and is used for to the connection between the gate line and an external signal input device to provide electric signals to the gate line, while the source/drain lead terminal extends to the source/drain metal layer and is used for the connection between the data line and the external signal input device to provide electrical signals to the data line.

Currently, usually the manufacturing process of the TFT-LCD array substrate requires at least four patterning processes: the first patterning process forms the gate metal layer, the second patterning process forms the amorphous semiconductor layer, the doped semiconductor layer and the source/drain metal layer, the third patterning process forms a protective layer comprising the via hole, the gate lead hole and the source/drain lead terminal for electrically connecting the drain electrode with the pixel electrode, and the fourth patterning process forms the pixel electrode layer.

However, the number of the patterning processes directly affect the manufacturing costs and yield, thus, the more the patterning processes are, the longer the production period is, the higher the manufacturing cost is, and the lower the yield is. Therefore, how to reduce the number of the patterning processes in the manufacturing process of the TFT-LCD array substrate has been a technical problem to be solved by one skilled in the art.

SUMMARY

The main purpose of the embodiments of present invention is to provide a method of manufacturing an array substrate, an array substrate and a display device, to reduce the number of the patterning processes in the manufacturing process of the TFT-LCD array substrate, and thereby effectively reduce manufacturing costs and improve yield.

In order to achieve the above purpose, the present invention adopts the following technical solutions:

On one hand, the present invention provides a method of manufacturing an array substrate, comprising:

forming the pattern of a gate metal layer comprising a gate line and a gate electrode, and preserving a photoresist at the position on the pattern of the gate metal layer corresponding to a gate lead hole;

sequentially forming a gate insulating thin film, a semiconductor thin film and a source/drain metal thin film;

removing the photoresist preserved at the position on the pattern of the gate metal layer corresponding to the gate lead hole, and forming the gate lead hole;

forming patterns of a source/drain metal layer comprising a source electrode, a drain electrode and a data line and a semiconductor layer; and forming a pattern comprising a pixel electrode layer and a channel.

On one hand, the present invention provides an array substrate, comprising:

a substrate, and a gate metal layer of a gate line and a gate electrode provided on the substrate, a gate insulating layer, a semiconductor layer, a source/drain metal layer comprising a source electrode, a drain electrode and a data line, and a pixel electrode layer provided on the gate metal layer, wherein a gate lead hole and a source/drain lead terminal are provided on the substrate, and the gate lead hole is connected with the gate metal layer via the pixel electrode layer.

On one hand, the present invention provides a display device, and the display device comprises the array substrate provided by the embodiments of the present invention.

As for the method of manufacturing the array substrate, the array substrate and the display device provided by the embodiments of the present invention, during manufacturing the TFT array substrate, the pattern comprising the pixel electrode layer and the channel is formed directly after the patterns of the source/drain metal layer and the semiconductor layer are formed, i.e., the gate lead hole is connected to the gate metal layer via the pixel electrode layer. The method of manufacturing the TFT array substrate, the array substrate and the display device according to the embodiments of the present invention adopt less patterning processes and effectively reduce the costs.

BRIEF DESCRIPTION OF THE DRAWINGS

In order to clearly illustrate the technical solutions of the embodiments of the invention, the drawings of the embodiments will be briefly described in the following; it is obvious that the described drawings are only related to some embodiments of the invention and thus are not limitative of the invention.

DETAILED DESCRIPTION

Figure 1:
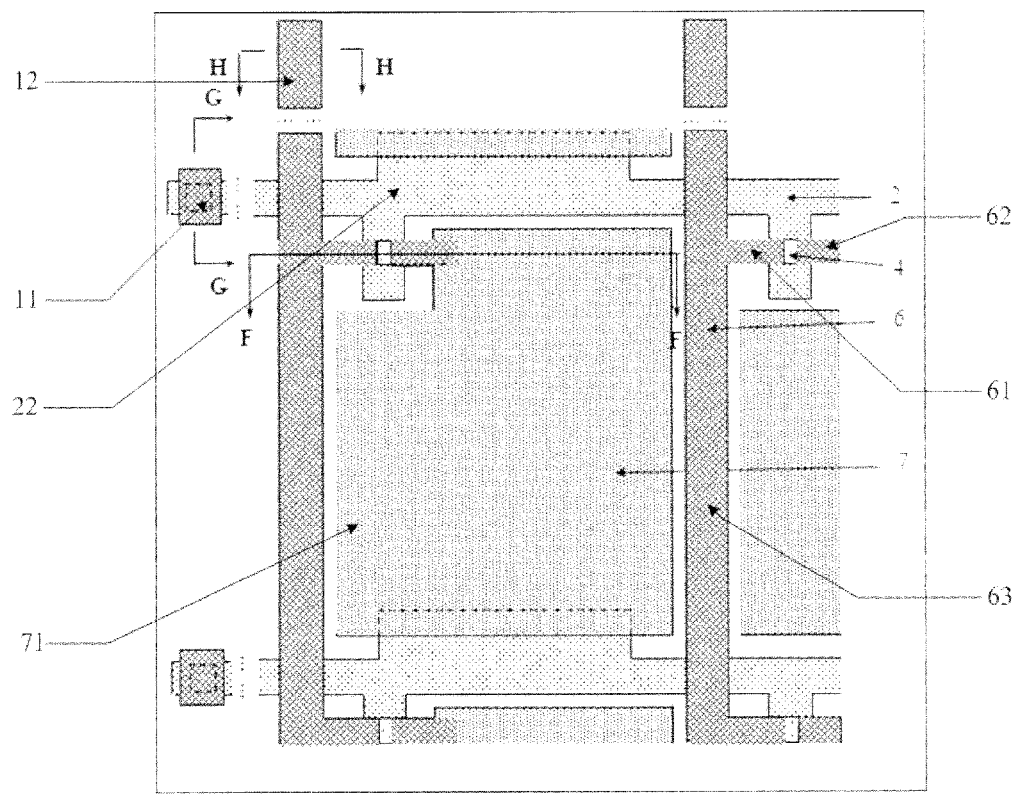
FIG. 1 is a planar schematic diagram of a TFT array substrate provided by an embodiment of the present invention.

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

A method of manufacturing the array substrate provided by an embodiment of the present invention may comprise:

forming a pattern of a gate metal layer comprising a gate line and a gate electrode, and preserving photoresist at a position of the pattern of the gate metal layer corresponding to a gate lead hole;

sequentially forming a gate insulating thin film, a semiconductor thin film and a source/drain metal thin film;

removing the photoresist preserved at the position of the pattern of the gate metal layer corresponding to the gate lead hole and forming the gate lead hole;

forming a pattern of a semiconductor layer and a source/drain metal layer comprising a source electrode, a drain electrode and a data line; and forming a pattern comprising a pixel electrode layer and a channel.

For the method of manufacturing the array substrate provided by the embodiments of the present invention, as the pattern comprising the pixel electrode layer and the channel is formed directly after the pattern of the source/drain metal layer and the semiconductor layer is formed, i.e., the pixel electrode layer is directly disposed on the source/drain metal layer, the pixel electrode layer is directly electrically connected with the source/drain metal layer and the via hole is not necessary for the connection, and the gate lead hole is connected with the gate metal layer via the pixel electrode layer, and the source/drain lead terminal is connected with the source/drain metal layer via the pixel electrode layer. The method of manufacturing the TFT array substrate adopts three patterning processes and effectively reduces the costs.

Furthermore, in an embodiment of the present invention, the step for forming the pattern comprising the pixel electrode layer and the channel comprises:

forming the pattern comprising the pixel electrode layer and the channel and preserving the photoresist on the pattern of the pixel electrode layer;

after the step of forming the pattern comprising the pixel electrode layer and the channel, the method further comprises:

forming an insulating protective thin film; and removing the photoresist preserved on the pattern of the pixel electrode layer, stripping the insulating protective thin film formed on the photoresist, so as to form an insulating protective structure above the channel.

Furthermore, in an embodiment of the present invention, the steps of forming the pattern of the gate metal layer comprising the gate line and the gate electrode and preserving the photoresist at the position of the pattern of the gate metal layer corresponding to the gate lead hole comprise:

forming the gate metal thin film on the substrate;

applying photoresist;

forming a first sub-structure of photoresist at the position of the gate metal thin film corresponding to the gate lead hole, forming a second sub-structure of photoresist at the gate metal thin film other than the position corresponding to the gate lead hole, and the thickness of the first sub-structure of photoresist being larger than that of the second sub-structure of photoresist;

forming the pattern of the gate metal layer comprising the gate line and the gate electrode; and removing the first sub-structure of photoresist partially in thickness and removing an entirety of the second sub-structure of photoresist.

Optionally, the first sub-structure of photoresist has a thickness of 1-4 microns, and the second sub-structure of photoresist has a thickness of 0.5-2 microns.

Optionally, in an embodiment of the present invention, the step of forming the pattern of the source/drain metal layer comprising the source electrode, the drain electrode and the data line and the semiconductor layer comprises:

applying photoresist;

preserving a second structure of photoresist on the pattern of the gate metal layer in the gate lead hole;

forming the semiconductor layer pattern and the source/drain metal layer pattern; and removing the second structure of photoresist.

Optionally, in an embodiment of the present invention, the step of forming the pattern comprising the pixel electrode layer and the channel comprises:

forming a transparent conductive thin film;

applying photoresist on the transparent conductive thin film, forming a third structure of photoresist corresponding to the pattern of the pixel electrode layer and the channel, the third structure of photoresist comprising the photoresist preserved at the position of the transparent conductive thin film corresponding to the gate lead hole and the photoresist preserved at the position of the transparent conductive thin film corresponding to the source/drain electrode lead terminal; and forming the pattern of the pixel electrode layer and the channel, and preserving the third structure of photoresist after forming the pixel electrode layer and the channel.

Furthermore, in an embodiment of the present invention, the step of forming the pattern of the pixel electrode layer and the channel and preserving the third structure of photoresist after forming the pixel electrode layer and the channel comprises:

etching the transparent conductive thin film exposed by the third structure of photoresist and forming the pattern of the pixel electrode layer; and continuing etching the source/drain metal layer pattern and the semiconductor layer pattern under the transparent conductive thin film exposed by the third structure of photoresist pattern, and forming the pattern of the channel.

Correspondingly, the array substrate provided by an embodiment of the present invention may comprise:

a substrate, and a gate metal layer of a gate line and a gate electrode provided on the substrate, a gate insulating layer, a semiconductor layer, a source/drain metal layer comprising a source electrode, a drain electrode and a data line, and a pixel electrode layer provided on the gate metal layer. The gate lead hole and the source/drain lead terminal are provided on the substrate; and the gate lead hole is connected with the gate metal layer via the pixel electrode layer.

As for the array substrate provided by the embodiment of the present invention, the pixel electrode layer is directly connected with the source/drain metal layer while the via hole is not necessary for the connection, and the gate lead hole is connected with the gate metal layer via the pixel electrode layer, such that, in the method of manufacturing the TN type TFT array substrate, the gate lead hole is obtained by the method of stripping, the patterning process is not necessary during forming the source/drain lead terminal, thus the number of the patterning processes is reduced, and the costs are effectively decreased and the yield is improved.

For example, the pixel electrode layer of the embodiments of the present invention can be directly disposed on the source/drain metal layer.

For example, the source/drain lead terminal of the embodiments of the present invention can be connected with the source/drain metal layer via the pixel electrode layer.

For example, in one embodiment of the present invention, in the array substrate, an insulating protective structure is disposed in a channel region of the source electrode and the drain electrode.

According to the description of the background art, the source/drain lead terminal is used to connect the data line with the external signal input device, thus, optionally, in an embodiment of the present invention:

the source/drain lead terminal is disposed on the data line;

the pixel electrode layer comprises the transparent conductive layer disposed on the data line, i.e., the transparent conductive layer and the pixel electrode are made at the same layer, thus the source/drain lead terminal is connected with the data line via the transparent conductive layer.

It should be explained that the array substrate provided by the embodiments of the present invention can be a TN (Twisted Nematic) type TFT (Thin Film Transistor) array substrate.

The array substrate and the method of manufacturing the array substrate provided by the embodiments of the present invention will be described in details hereinafter through specific embodiments.

Figure 2:
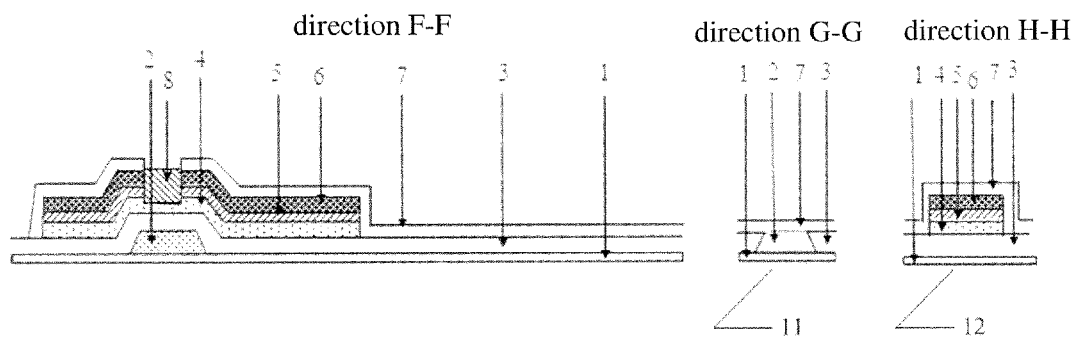
FIG. 2 is a sectional diagram of a seventh state in directions F-F, G-G and H-H in FIG. 1.

In combination with FIGS. 1 and 2, FIG. 1 is a planar schematic diagram of the TFT array substrate provided by an embodiment of the present invention, FIG. 2 is a sectional diagram in direction F-F, G-G and H-H as illustrated in FIG. 1, in combination with the method of manufacturing the array substrate to be described hereinafter, the sectional diagram is a sectional diagram of the seventh state in directions F-F, G-G and H-H in FIG. 1 in the manufacturing method.

The TFT array substrate of the present embodiment may comprise:

a substrate 1, for example, the substrate 1 can be a glass substrate or a quartz substrate;

a gate metal layer 2 disposed on the substrate 1, wherein the gate metal layer 2 comprises a gate line 22 and a gate electrode 21 of the TFT;

a gate insulating layer 3, an amorphous semiconductor layer 4, a doped semiconductor layer 5, a source/drain metal layer 6 and a pixel electrode layer 7 disposed on the gate metal layer 2;

the source/drain metal layer 6 comprises a source electrode 61, a drain electrode 62 and a data line 63 of the TFT;

the pixel electrode layer 7 is formed of the transparent conductive thin film, wherein the pixel electrode layer 7 comprises a pixel electrode 71;

a gate lead hole 11 and a source/drain lead terminal 12 are further disposed on the substrate, the position of the section in direction G-G in FIG. 1 is the position of the gate lead hole 11, the position of the section in direction H-H is the position of the source/drain lead terminal 12, the gate lead hole 11 is used to connect the gate line 22 with the external signal input device (not illustrated) and then provide electric signals for the gate line 22, while the source/drain lead terminal 12 is used to connect the data line 63 with the external signal input device (not illustrated) and then provide electric signals for the data line 63; and Furthermore, the channel region of the source electrode 61 and the drain electrode 62 has an insulating protective structure 8.

As illustrated in FIGS. 1 and 2, the gate lead hole 11 comprises the gate metal layer 2 and the pixel electrode layer 7 thereunder sequentially laminated on the substrate 1. The source/drain lead terminal 12 comprises the source/drain metal layer 6 and the pixel electrode layer 7 sequentially laminated on the substrate 1.

For example, the gate metal layer 2 directly under the gate lead hole 11 is connected with the gate line 22, and the source/drain metal layer 6 in the source/drain lead terminal 12 is connected with the data line 63. For example, as illustrated in FIG. 1, the gate lead hole 11 and the source/drain lead terminal 12 are disposed in the peripheral region of the substrate.

Especially, in the present embodiment, the pixel electrode layer 7 is disposed directly above the source/drain metal layer 6, the data line 63 substantially is a double layered structure constituted by a metal and a transparent conductive thin film, while the pixel electrode 71 is directly adhered to the drain electrode 62 so as to be electrically connected with the drain electrode 62, i.e., they are not separated by an insulating layer and the via hole is not necessary for their electrical connection; the source electrode 61 is also adhered with the transparent conductive thin film in the pixel electrode layer 7 thereon, and the gate lead hole 11 is connected to the gate metal layer 2, i.e., the gate line 22, via the transparent conductive thin film in the pixel electrode layer 7, while the source/drain lead terminal 12 is connected with the source/drain metal layer 6, i.e., the data line 63, via the transparent conductive thin film in the pixel electrode layer 7.

For example, the transparent conductive thin film on the data line 63 is made at the same layer with the pixel electrode 71.

As for the array substrate in the embodiments of the present invention, on the one hand, the pixel electrode layer 7 is directly disposed on the source/drain metal layer 6, i.e., the pixel electrode layer 7 is directly connected with the source/drain metal layer 6 electrically, and the via hole is not necessary for the connection, and the gate lead hole 11 is connected with the gate metal layer 2 via the pixel electrode layer 7, and the source/drain lead terminal 12 is connected with the source/drain metal layer 6 via the pixel electrode layer 7, such that, in the method of manufacturing the array substrate, the patterning process is not necessary neither in forming the via hole for the connection between the pixel electrode layer 7 and the source/drain metal layer 6, nor in forming the gate lead hole 11 and the source/drain lead terminal 12, thus the numbers of the patterning processes is reduced, the cost is reduced effectively and the yield is improved.

On the other hand, as the pixel electrode layer 7 is directly electrically connected with the source/drain metal layer 6 such that the data line 63 substantially is a double layered structure constituted by a metal and a transparent conductive thin film, the resistance of the data line 63 can be reduced. Likewise, as the pixel electrode 71 is directly adhered to the drain electrode 62 and thereby electrically connected with the drain electrode 62, contact resistance is effectively reduced, while the gate lead hole 11 is connected to the gate metal layer 2, i.e., the gate line 22, via the transparent conductive thin film in the pixel electrode layer 7, such that the contact resistance between the external signal input device and the gate line 22 can also be reduced effectively when the external signal input device is connected with the gate line 22 via the gate lead hole 11, likewise, as the source/drain lead terminal 12 is connected with the source/drain metal layer 6, i.e., the data line 63, via the transparent conductive thin film in the pixel electrode layer 7, the contact resistance between the external signal input device and the data line 63 can also be reduced effectively when the external signal input device is connected with the data line 63 via a source/drain lead terminal 22.

It should be explained that the so-called patterning processes in the embodiments of the present invention can comprise at least one of the steps of photoresist applying, exposing, developing, etching, photoresist stripping and etc.

Correspondingly, the embodiments of the present invention further provide a method of manufacturing the TFT array substrate provided by the above embodiments of the present invention. It should be explained that, for convenient description, the thin films of forming the layers in the TFT array substrate are marked with the same reference signs with the pattern structures of the layers formed by the thin films, for example, the reference sign of the gate metal layer is 2, while the gate metal thin film forming the gate metal layer pattern is also marked by 2.

Figure 3:
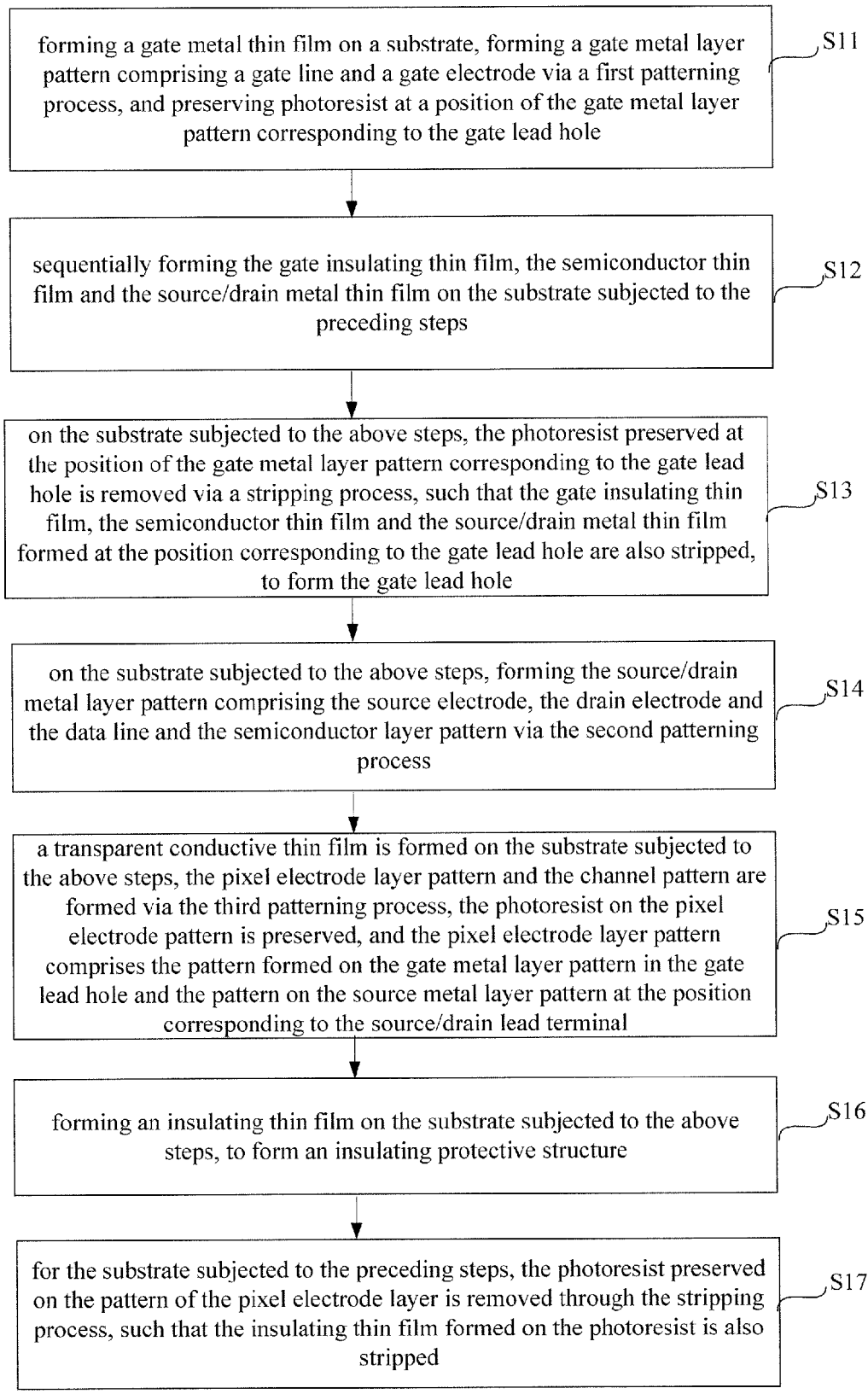
FIG. 3 is a flow chart of a method of manufacturing the TFT array substrate provided by an embodiment of the present invention.

As illustrated in FIG. 3, the manufacturing method provided by the embodiments of the present invention comprises the following steps:

S11, forming a gate metal thin film on a substrate, forming a gate metal layer pattern comprising a gate line and a gate electrode via a first patterning process, and preserving photoresist at a position of the gate metal layer pattern corresponding to the gate lead hole.

Figure 4:
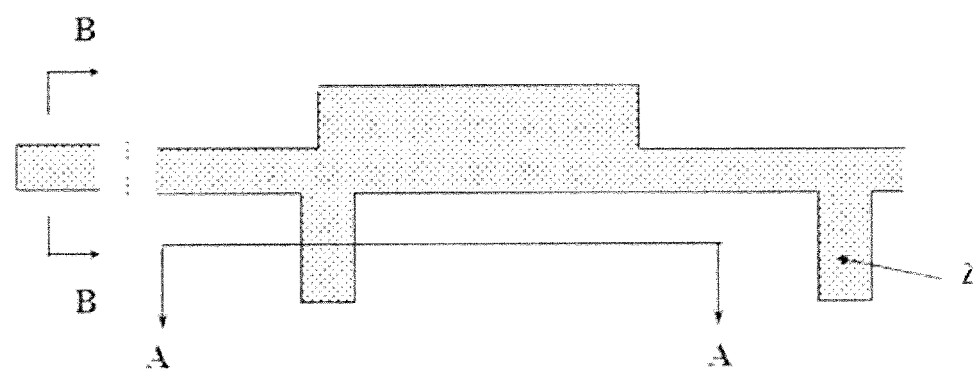
FIG. 4 is a planar schematic diagram of the TFT array substrate after the first patterning process provided by the embodiment of the present invention.
Figure 5:
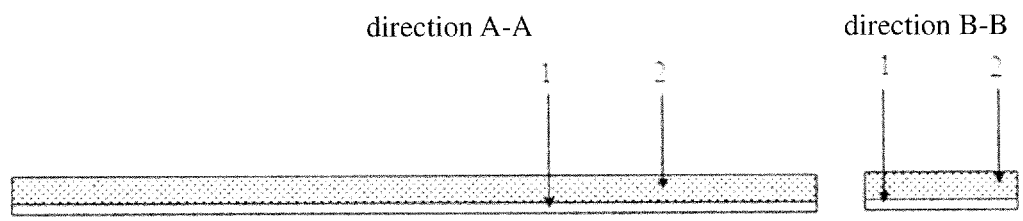
FIG. 5 is a sectional diagram of a first state in directions A-A and B-B as illustrated in FIG. 4.
Figure 6:
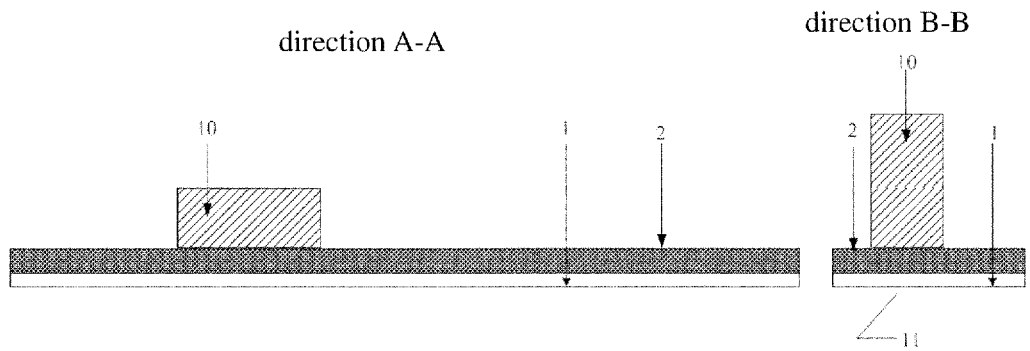
FIG. 6 is a sectional diagram of a second state in directions A-A and B-B as illustrated in FIG. 4.

In combination with FIGS. 4-8, optionally, the present step can be implemented specifically in the following way, wherein, FIG. 4 is a structural schematic diagram of the array substrate formed after the present step, FIGS. 5-8 are diagrams of different states of the cross section corresponding to directions A-A and B-B after the preceding process steps, wherein the position of the section in direction B-B corresponds to the position of the gate lead hole.

In the present step, first, the gate metal thin film 2 is formed on the substrate 1, and the substrate 1 can be a transparent glass substrate or a quartz substrate. After forming the gate metal thin film 2, for the state of the cross section corresponding to directions A-A and B-B in FIG. 4, please refer to the sectional diagram of the first state in FIG. 5. Specifically, a method of sputtering or thermal evaporation can be adopted to deposit a layer of the metal thin film having the thickness of 500~4000 Å on the substrate 1. The gate metal thin film 2 can be a metal of Cr, W, Ti, Ta, Mo, Al, Cu, or the like, or an alloy thereof, and of course, the gate metal thin film 2 can also be formed by a plurality of metal thin films, while the embodiments of the present invention do not define this herein.

Then, the photoresist is applied on the gate metal thin film 2, for example, the coated photoresist can have a thickness of 1~4 microns, then, a first photoresist pattern 10 is formed via a semipermeable exposure process and development. After forming the first photoresist pattern 10, for the state of the cross section corresponding to directions A-A and B-B in FIG. 4, please refer to the sectional diagram of the second state of FIG. 6. The first photoresist pattern 10 comprises the first sub-structure of photoresist (refer to the left side view of FIG. 6) at the position of the gate metal thin film 2 corresponding to the gate lead hole 11 and the second sub-structure of photoresist (refer to the right side view of FIG. 6) at the position of the gate metal thin film 2 other than the position corresponding to the gate lead hole 11, and the thickness of the first sub-structure of photoresist is greater than that of the second sub-structure of photoresist. Specifically, the first sub-structure of photoresist has a thickness of about 1~4 microns, while the second sub-structure of photoresist has a thickness of about 0.5~2 microns.

Figure 7:
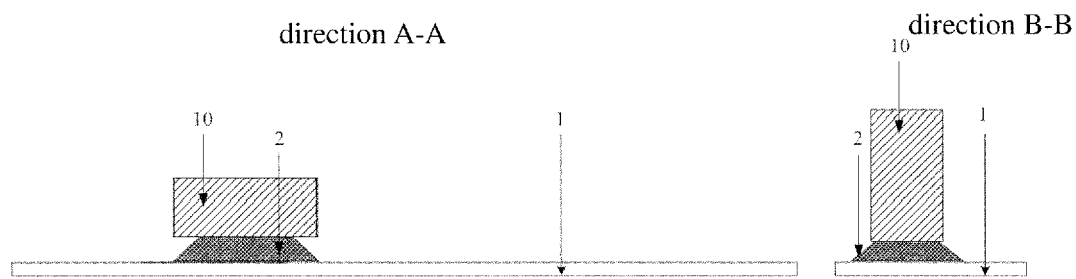
FIG. 7 is a sectional diagram of a third state in directions A-A and B-B as illustrated in FIG. 4.
Figure 8:
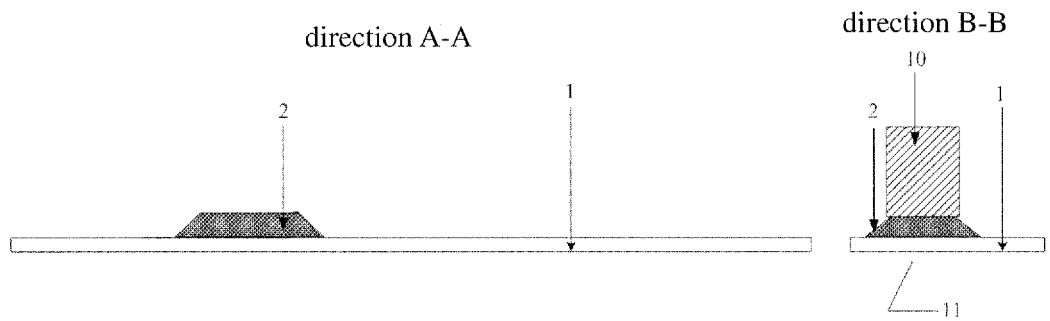
FIG. 8 is a sectional diagram of a fourth state in directions A-A and B-B as illustrated in FIG. 4.

Then, the gate metal thin film exposed by the first photoresist pattern 10 is etched, and then the pattern of the gate metal layer 2 comprising the gate line and the gate electrode is formed, and after etching, for the state of the cross section corresponding to the directions A-A and B-B in FIG. 4, please refer to the sectional diagram of the third state of FIG. 7.

For example, a chemical method can be used to conduct acid etching, and the used acid can be sulfuric acid, nitric nitrate, acetic acid and mixed acid of certain concentration, which is used to etch the patterns of the gate line and gate lead line, so as to form the pattern of the gate metal layer 2.

Next, the first photoresist pattern 10 can be thinned by a dry ashing process, and specifically, the photoresist can be thinned in an oxygen containing atmosphere, and thereby part of the thickness of the first sub-structure of photoresist is removed, even if the photoresist is preserved at the position of the pattern of the gate meta layer 2 corresponding to the gate lead hole 11, as the second sub-structure of photoresist is removed completely, the photoresist at other positions is also removed. For example, the first sub-structure of photoresist can be ashed to a thickness of about 0.5~2 microns, while the second sub-photoresist at other positions can be ashed completely. After the dry ashing treatment, for the state of the cross section corresponding to the directions A-A and B-B in FIG. 4, please refer to the sectional diagram of the fourth state of FIG. 8.

After the above treatment, an early structure of the array substrate as illustrated in FIG. 4 is formed.

It can be understood that, in the embodiments of the present invention, for convenient understanding, the drawings are respectively a part of the array substrate, and the array substrate actually comprises the portions illustrated in the drawings.

S12, sequentially forming the gate insulating thin film, the semiconductor thin film and the source/drain metal thin film on the substrate subjected to the preceding steps.

Figure 9:
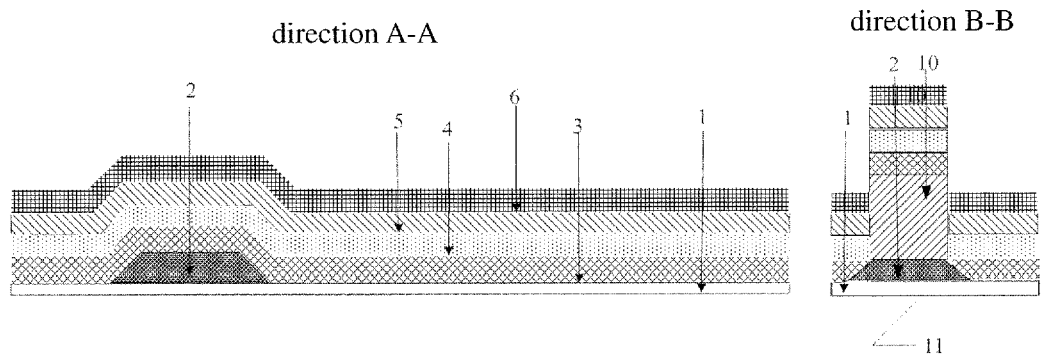
FIG. 9 is a sectional diagram of a fifth state in directions A-A and B-B as illustrated in FIG. 4.

In the present step, a plurality of films are deposited on the substrate 1 formed with the pattern of the gate metal layer 2, the gate insulating thin film 3, the semiconductor thin film and the source/drain metal thin film 6 are sequentially deposited, wherein, the semiconductor thin film can comprise the amorphous semiconductor thin film and the doped semiconductor thin film, for example, it can be the amorphous silicon thin film 4 and the doped semiconductor thin film 5, and the doped semiconductor thin film 5 can be, for example, an n-type silicon thin film. After the present step, for the state of the cross section corresponding to directions A-A and B-B in FIG. 4, please refer to the sectional diagram of the fifth state in FIG. 9. In step S11, as the pattern of the gate metal layer 2 in the gate lead hole 11 is preserved with a certain thickness of the first sub-structure of photoresist, the deposited plurality of films are all deposited on the preserved first sub-structure of photoresist.

For example, a chemical vapor deposition process can be used to continuously deposit the gate insulating layer thin film 3 of 1000~6000 Å, the amorphous silicon thin film 4 of 1000~6000 Å, the n-type silicon thin film 5 of 200~1000 Å, and the source/drain metal thin film 6 of 1000~7000 Å on the substrate 1. Of course, the plurality of films can also be deposited on the substrate 1 with other methods, which are not defined herein.

It should be explained that the material for the gate insulating thin film 3 usually is silicon nitride, and can also be silicon oxide and silicon oxynitride.

S13, on the substrate subjected to the above steps, the photoresist preserved at the position of the gate metal layer pattern corresponding to the gate lead hole is removed via a stripping process, such that the gate insulating thin film, the semiconductor thin film and the source/drain metal thin film formed at the position corresponding to the gate lead hole are also stripped, to form the gate lead hole.

In the present step, for example, the photoresist 10 preserved on the pattern of the gate metal layer 2 at the position of the gate lead hole 22 is removed via the stripping process, such that the pattern of the gate metal layer 2 above the position, the pattern of the gate insulting layer 3, the semiconductor thin film (the amorphous semiconductor thin film 4 and the doped semiconductor thin film 5) and the source/drain metal thin film 6 at the position of the gate lead are also stripped, and the initial structure of the gate lead hole 11 is formed thereby.

Figure 10:
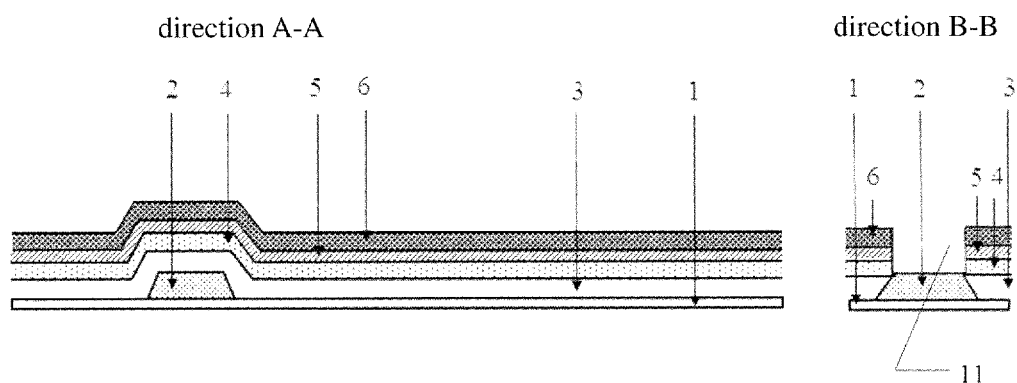
FIG. 10 is a sectional diagram of a sixth state in directions A-A and B-B as illustrated in FIG. 4.

After the present step, for the state of the cross section corresponding to directions A-A and B-B in FIG. 4, please refer to the sectional diagram of the sixth state as illustrated in FIG. 10.

S14, on the substrate subjected to the above steps, forming the source/drain metal layer pattern comprising the source electrode, the drain electrode and the data line and the semiconductor layer pattern via the second patterning process.

The pattern of the source/drain metal layer 6 comprises a metal thin film portion corresponding to the source/drain lead terminal 12.

Figure 11:
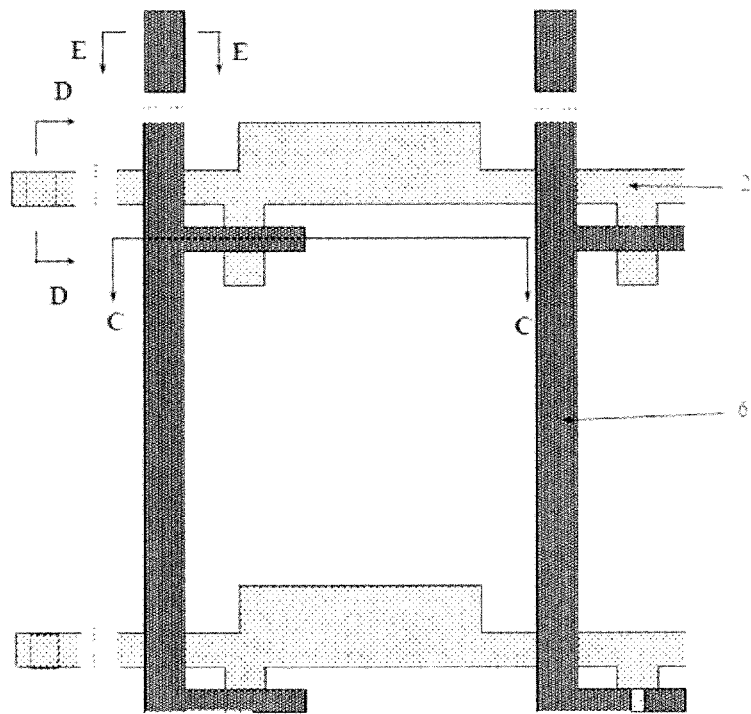
FIG. 11 is a planar schematic diagram of the TFT array substrate after a second patterning process provided by the embodiment of the present invention.
Figure 12:
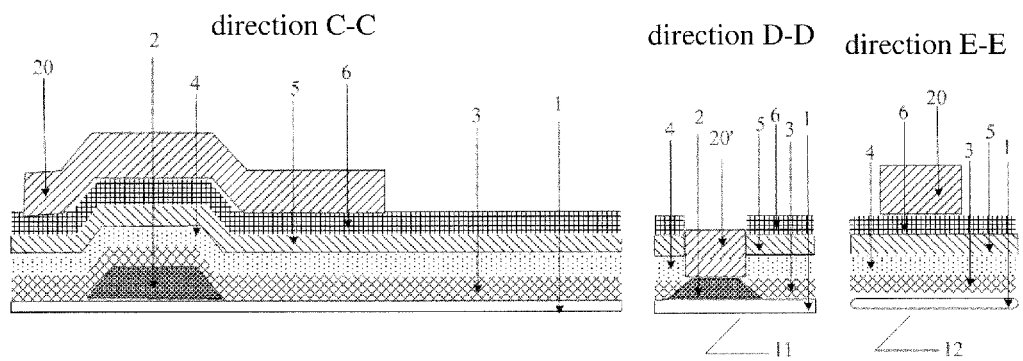
FIG. 12 is a sectional diagram of a first state in directions C-C, D-D and E-E as illustrated in FIG. 11.
Figure 13:
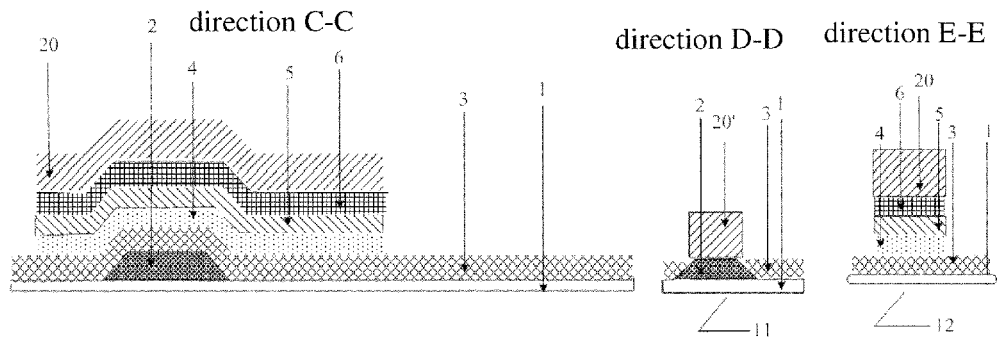
FIG. 13 is a sectional diagram of a second state in directions C-C, D-D and E-E as illustrated in FIG. 11.
Figure 14:
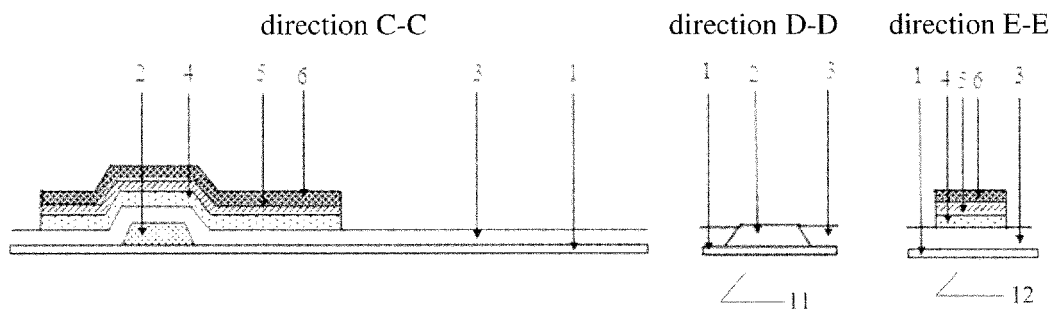
FIG. 14 is a sectional diagram of a third state in directions C-C, D-D and E-E as illustrated in FIG. 11.

In combination with FIGS. 11-14, optionally, the present step can be implemented specifically in the following way, wherein, FIG. 11 is a structural schematic diagram of the array substrate formed after the present step, FIGS. 12-14 are sectional diagrams of different states of the cross sections corresponding to the directions C-C, D-D and E-E after the preceding process steps in FIG. 12, wherein the position of the section in direction D-D corresponds to the position of the gate lead hole, and the position of the section in direction E-E corresponds to the position of the source/drain lead terminal.

First, the photoresist is applied on the substrate where the pattern of the gate metal layer 2, the gate insulating thin film 3, the semiconductor thin film (the amorphous semiconductor thin film 4 and the doped semiconductor thin film 5) and the source/drain metal thin film 6 are formed, a second structure of photoresist pattern 20 corresponding to the semiconductor layer (the amorphous semiconductor layer 4 and the doped semiconductor layer 5) and the source/drain metal layer 6 is formed via an exposing process and developing, and the photoresist is preserved at the gate metal layer portion in the gate lead hole 11, to protect the pattern portion of the gate metal layer 2 in the gate lead hole 11.

For example, the second structure of photoresist pattern 20 is formed on a glass substrate with a mask plate and via the exposing process and developing, and the second structure of photoresist pattern 20 comprises the photoresist preserved on the metal thin film portion on the pattern of the source/drain metal layer 6 corresponding to the source/drain lead terminal 12 and the photoresist 20' preserved on the pattern of the gate metal layer 2 at the position corresponding to the gate lead hole 11, so as to protect the pattern portion of the gate metal layer 2 in the gate lead hole. After developing, for the state of the cross section corresponding to directions C-C, D-D and E-E in FIG. 11, please refer to the sectional diagram of the first state as illustrated in FIG. 12.

Then, the source/drain metal thin film 3 exposed by the second structure of photoresist pattern 20 and the semiconductor thin film (the amorphous semiconductor thin film 4 and the doped semiconductor thin film 5) under the source/drain metal thin film 3 exposed by the second structure of photoresist pattern 20 are etched, to form the semiconductor layer pattern (the amorphous semiconductor layer 4 and the doped semiconductor layer 5) and the pattern of the source/drain metal layer 6. Optionally, first, a dry or wet etching is conducted to the drain metal thin film 6 exposed by the second structure of photoresist pattern 20 to form the pattern of the source/drain meta layer 6; and then, a dry or wet etching method is continuously conducted to the semiconductor thin film (the amorphous semiconductor thin film 4 and the doped semiconductor thin film 5) under the drain metal thin film 6 exposed by the second structure of photoresist pattern 20, to form the semiconductor layer pattern (the pattern of the amorphous semiconductor layer 4 and the pattern of the doped semiconductor layer 5).

After etching, for the state of the cross section corresponding to directions C-C, D-D and E-E in FIG. 11, please refer to the sectional diagram of the second state as illustrated in FIG. 13. The photoresist 20' is preserved on the pattern portion of the gate metal layer 2 in the gate lead hole 11, thus, under the protection of the photoresist 20', etching the semiconductor pattern and the pattern of the source/drain metal layer 6 does not affect the pattern of the gate metal layer 2 in the gate lead hole 11.

Then, the second structure of photoresist pattern 20 is removed, i.e., via the stripping process, the photoresist 20 on the pattern of the source/drain metal layer 6 and the semiconductor layer pattern (the amorphous semiconductor layer 4 and the doped semiconductor layer 5) and the photoresist 20' in the gate lead hole are removed. After removing the second structure of photoresist pattern 20, for the state of the cross section corresponding to directions C-C, D-D and E-E in FIG. 12, please refer to the sectional diagram of the third state as illustrated in FIG. 14.

In the present step, after the above treatment, the structure of the array substrate as illustrated in FIG. 11 is formed.

S15, a transparent conductive thin film is formed on the substrate subjected to the above steps, the pixel electrode layer pattern and the channel pattern are formed via the third patterning process, the photoresist on the pixel electrode pattern is preserved, and the pixel electrode layer pattern comprises the pattern formed on the gate metal layer pattern in the gate lead hole and the pattern on the source metal layer pattern at the position corresponding to the source/drain lead terminal.

In combination with FIGS. 1 and 15-19, optionally, the present step can be implemented in the following way, and FIGS. 15-19 are sectional diagrams of different states of the cross section corresponding to directions F-F, G-G and H-H in FIG. 1 after the preceding process steps, wherein the position of the section in direction G-G corresponds to the position of the gate lead hole, and the position of the section in the direction H-H corresponds to the position of the source/drain lead terminal.

First, a transparent conductive thin film is deposited on the substrate where the pattern of the gate metal layer 2, the pattern of the gate insulating layer 3, the semiconductor layer pattern (the pattern of the amorphous semiconductor layer 4 and the pattern of the doped semiconductor layer 5) and the pattern of the source/drain metal layer 6 are formed.

Figure 15:
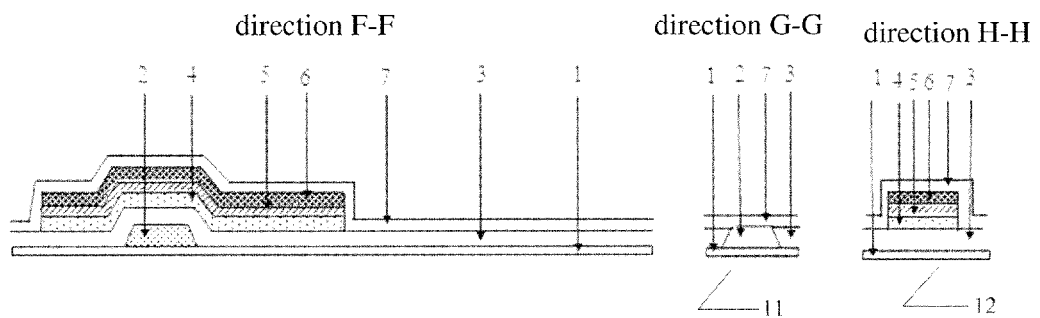
FIG. 15 is a sectional diagram of a first state in directions F-F, G-G and H-H as illustrated in FIG. 1.
Figure 16:
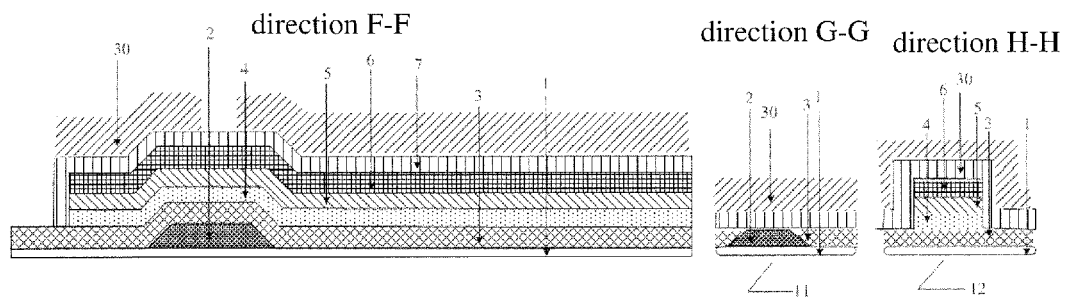
FIG. 16 is a sectional diagram of a second state in directions F-F, G-G and H-H as illustrated in FIG. 1.

Specifically, a transparent conductive thin film 7 having a thickness within 100~1000 Å is deposited on the entire substrate 1, and after depositing the transparent conductive thin film, for the state of the cross section in directions F-F, G-G and H-H FIG. 1, please refer to the sectional diagram of the first state as illustrated in FIG. 15. The transparent conductive thin film 7 is deposited on both the gate metal layer pattern in the gate lead hole 11 and a portion of the pattern of the source/drain metal layer 6 corresponding to the source/drain lead terminal 12. Wherein, the common material of the transparent conductive thin film can be ITO or IZO, and the present invention does not make any definition herein.

Then, the photoresist is coated on the substrate where the pattern of the gate metal layer 2, the pattern of the gate insulating layer 3, the semiconductor layer pattern (the pattern of the amorphous semiconductor layer 4 and the pattern of the doped semiconductor layer 5) and the pattern of the source/drain metal layer 6 are formed and the transparent conductive thin film 7 is deposited. A third structure of photoresist pattern 30 corresponding to the pattern of the pixel electrode layer 7 and the pattern of the channel 9 is formed via the exposing process and developing. After the developing, for the state of the cross section in directions F-F, G-G and H-H in FIG. 1, please refer to the sectional diagram of the second state illustrated in FIG. 16, and the third structure of photoresist pattern 30 comprises the photoresist preserved at the position of the transparent conductive thin film corresponding to the gate lead hole and the photoresist preserved at the position of the transparent conductive thin film corresponding to the source/drain lead terminal.

Next, etching is conducted to the transparent conductive thin film 7 exposed by the third structure of photoresist pattern 30 and the pattern of the source/drain metal layer 6 and the semiconductor layer pattern (the pattern of the amorphous semiconductor layer 4 and the pattern of the doped semiconductor layer 5) under the transparent conductive thin film 7 exposed by the third structure of photoresist pattern 30, to form the pattern of the pixel electrode layer 7 and the initial pattern of the channel 9. It should be explained that the third structure of photoresist pattern 30 should be preserved after forming the pattern of the pixel electrode layer 7 and the pattern of the channel 9.

Figure 17:
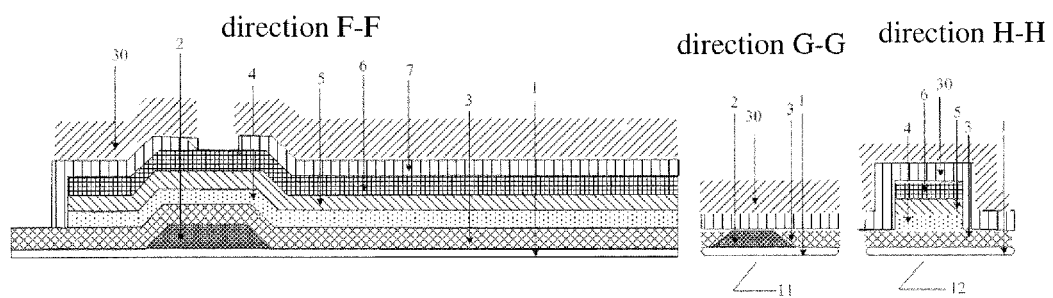
FIG. 17 is a sectional diagram of a third state in directions F-F, G-G and H-H as illustrated in FIG. 1.
Figure 18:
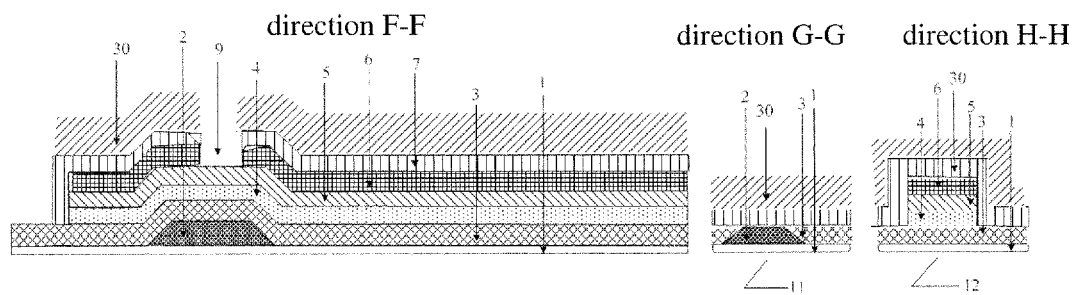
FIG. 18 is a sectional diagram of a fourth state in directions F-F, G-G and H-H as illustrated in FIG. 1.
Figure 19:
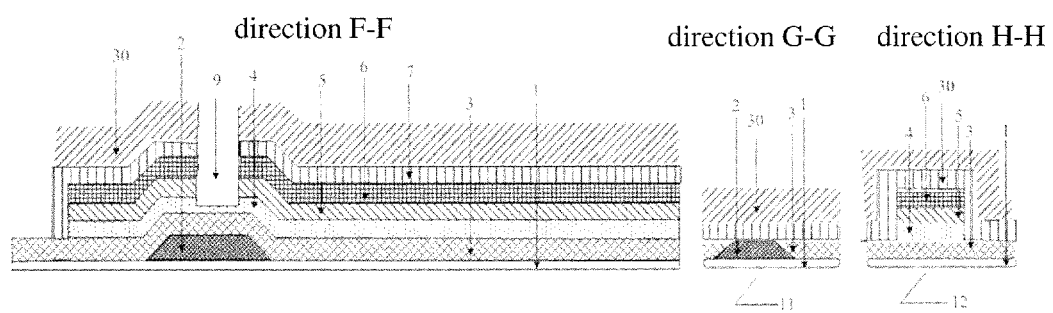
FIG. 19 is a sectional diagram of a fifth state in directions F-F, G-G and H-H as illustrated in FIG. 1.

For example, first, a chemical etching is conducted to the transparent conductive thin film 7 exposed by the third structure of photoresist pattern 30, to form the pattern of the pixel electrode layer 7, and after the etching, for the state of the cross section in directions F-F, G-G and H-H in FIG. 1, please refer to the sectional diagram of the third state illustrated in FIG. 17.

Then, etching is continued on the pattern of the source/drain metal layer 2 and part of the semiconductor layer pattern (the pattern of the amorphous semiconductor layer 4 and part of the pattern of the doped layer 5) under the transparent conductive thin film 7 exposed by the third structure of photoresist pattern 30.

The pattern of the channel 9 is formed thoroughly by conducting the dry etching. After etching the pattern of the source/drain metal layer 2, for the state of the cross section in directions F-F, G-G and H-H in FIG. 1, please refer to the sectional diagram of the fourth state illustrated in FIG. 18, and then, after etching the pattern of the semiconductor layer, for the state of the cross section in directions F-F, G-G and H-H in FIG. 1, please refer to the sectional diagram of the fifth state illustrated in FIG. 19.

S16, forming an insulating thin film on the substrate subjected to the above steps, to form an insulating protective structure.

Figure 20:
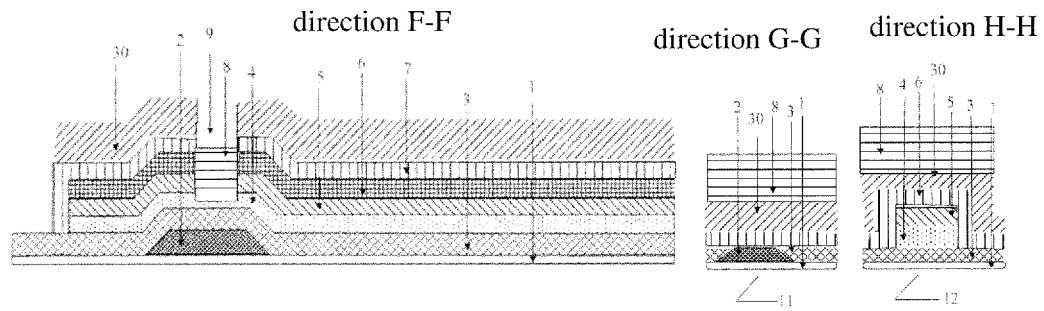
FIG. 20 is a sectional diagram of a sixth state in directions F-F, G-G and H-H as illustrated in FIG. 1.

Specifically, an insulating thin film 8 having a thickness of 1000-6000 Å can be deposited on the substrate 1 with a chemical vapor deposition process, and thereby the insulating protective structure 8 is deposited in the pattern of the channel 9. After the present step, for the state of the cross section in directions F-F, G-G and H-H in FIG. 1, please refer to the sectional diagram of the sixth state illustrated in FIG. 20.

S17, for the substrate subjected to the preceding steps, the photoresist preserved on the pattern of the pixel electrode layer is removed through the stripping process, such that the insulating thin film formed on the photoresist is also stripped.

For example, referring to FIG. 2, the photoresist pattern 30 on the pattern of the pixel electrode layer 7 is removed by the stripping process, such that the insulating thin film deposited on the photoresist pattern 30 is also stripped.

To sum up, in combination with FIGS. 1 and 2, after the above treatment, the TN type TFT array substrate provided by the embodiments of the present invention is formed, comprising: a substrate 1 on which a gate metal layer 2 is disposed; a gate insulating layer 3, a semiconductor layer comprising the amorphous silicon semiconductor layer 4 and the doped layer 5, a source/drain metal layer 6, a pixel electrode layer 7 and an insulating protective layer 8 are disposed on the gate metal layer 2; the substrate is also provided with the gate lead hole 11 and the source/drain lead terminal 12, the pixel electrode layer 7 is directly disposed on the source/drain metal layer 6 and the via hole is not necessary for the connection between them; the gate lead hole 11 is connected to the gate metal layer 2 via the transparent conductive thin film in the pixel electrode layer 7, while the source/drain lead terminal 12 is connected with the source/drain metal layer 6 via the transparent conductive thin film in the pixel electrode layer 7.

From the description of the method embodiments, for the TN type TFT array substrate and its manufacturing method provided by the embodiments of the present invention, only three patterning process are required in the manufacturing method, thus, compared with the prior art, the number of the patterning processes is reduced, thus the costs are effectively reduced and the yield is improved.

Correspondingly, the embodiments of the present invention further provide a display device comprising the substrate of any one of the preceding embodiments, thus it is not described herein. For other portions of the display device, please refer to the prior art.

The display device comprises any products or members having a display function, such as liquid crystal panel, electronic paper, OLED (Organic Light-Emitting Diode) panel, mobile phone, flat computer, television, display, notebook computer, digital photo frame and navigators, which is not defined in the present invention.

The embodiments described above are just exemplary ones of the present invention, and are not intended to limit the scope of protection of the invention. The scope of protection of the present invention shall be defined by the appended claims.

The invention claimed is:

1. A method of manufacturing an array substrate, comprising:
    forming a pattern of a gate metal layer comprising a gate line and a gate electrode and preserving photoresist at a position on the pattern of the gate metal layer corresponding to a gate lead hole;
    sequentially forming a gate insulating thin film, a semiconductor thin film and a source/drain metal thin film;
    removing the photoresist preserved at the position on the pattern of the gate metal layer corresponding to the gate lead hole, and forming the gate lead hole;
    forming a pattern of a semiconductor layer and a source/drain metal layer comprising a source electrode, a drain electrode and a data line; and
    forming a pattern comprising a pixel electrode layer and a channel,
    wherein, forming the pattern comprising the pixel electrode layer and the channel comprises:
    forming a transparent conductive thin film;
    applying photoresist on the transparent conductive thin film, forming a third structure of photoresist corresponding to the pattern of the pixel electrode layer and the channel, the third structure of photoresist comprising the photoresist preserved at a position on the transparent conductive thin film corresponding to the gate lead hole and the photoresist preserved at a position on the transparent conductive thin film corresponding to a source/drain lead terminal; and
    forming the pattern of the pixel electrode layer and the channel, and preserving the third structure of photoresist after forming the pixel electrode layer and the channel,
    wherein, after forming the pattern comprising the pixel electrode layer and the channel, the method further comprises:
    forming an insulating protective thin film; and
    removing the photoresist preserved on the patter of the pixel electrode layer, and stripping the insulating protective thin film formed on the photoresist at the same time, to form an insulating protective structure above the channel.

2. The manufacturing method according to claim 1, wherein, forming the pattern of the gate metal layer comprising the gate line and the gate electrode and preserving the photoresist at the position on the pattern of the gate metal layer corresponding to the gate lead hole comprise:
    forming a gate metal thin film on the substrate;
    applying the photoresist;
    forming a first sub-structure of photoresist at the position of the gate metal thin film corresponding to the gate lead hole, forming a second sub-structure of photoresist at a position of the gate metal thin film other than the position corresponding to the gate lead hole, and the first sub-structure of photoresist having a thickness larger than that of the second sub-structure of photoresist;
    forming the pattern of the gate metal layer comprising the gate line and the gate electrode; and
    removing the first sub-structure of photoresist partially in thickness and removing an entirety of the second sub-structure of photoresist.

3. The manufacturing method according to claim 2, wherein, the first sub-structure of photoresist has a thickness of 1-4 microns, and the second sub-structure of photoresist has a thickness of 0.5-2 microns.

4. The manufacturing method according to claim 1, wherein, forming the pattern of the semiconductor layer and the source/drain metal layer comprising the source electrode, the drain electrode and the data line comprises:
    applying photoresist;
    preserving a second structure of photoresist on the pattern of the gate metal layer in the gate lead hole;
    forming the pattern of the semiconductor layer pattern and the source/drain metal layer; and
    removing the second structure of photoresist.

5. The manufacturing method according to claim 1, wherein, forming the pattern of the pixel electrode layer and the channel and preserving the third structure of photoresist after forming the pixel electrode layer and the channel comprise:
    etching the transparent conductive thin film exposed by the third structure of photoresist, and forming the pattern of the pixel electrode layer; and
    continuing etching the source/drain metal layer pattern and the semiconductor layer pattern under the transparent conductive thin film exposed by the third structure of photoresist pattern, and forming the pattern of the channel.

6. The manufacturing method according to claim 1, wherein, forming the pattern of the gate metal layer comprising the gate line and the gate electrode and preserving the photoresist at the position on the pattern of the gate metal layer corresponding to the gate lead hole comprise:
    forming a gate metal thin film on the substrate;
    applying the photoresist;
    forming a first sub-structure of photoresist at the position of the gate metal thin film corresponding to the gate lead hole, forming a second sub-structure of photoresist at a position of the gate metal thin film other than the position corresponding to the gate lead hole, and the first sub-structure of photoresist having a thickness larger than that of the second sub-structure of photoresist;
    forming the pattern of the gate metal layer comprising the gate line and the gate electrode; and
    removing the first sub-structure of photoresist partially in thickness and removing an entirety of the second sub-structure of photoresist.

7. The manufacturing method according to claim 1, wherein, forming the pattern of the semiconductor layer and the source/drain metal layer comprising the source electrode, the drain electrode and the data line comprises:
  applying photoresist;
  preserving a second structure of photoresist on the pattern of the gate metal layer in the gate lead hole;
  forming the pattern of the semiconductor layer pattern and the source/drain metal layer; and
  removing the second structure of photoresist.

\* \* \* \* \*